United States Patent [19]

Otani

[11] Patent Number: 5,783,750
[45] Date of Patent: Jul. 21, 1998

[54] SEMICONDUCTOR SENSOR INCLUDING LAMINATED SUPPORTING PEDESTAL

[75] Inventor: Hiroshi Otani, Tokyo, Japan

[73] Assignee: Mitsubishi Denki Kabushiki Kaisha, Tokyo, Japan

[21] Appl. No.: 731,130

[22] Filed: Oct. 10, 1996

Related U.S. Application Data

[62] Division of Ser. No. 582,055, Jan. 2, 1996.

[30] Foreign Application Priority Data

Feb. 28, 1995 [JP] Japan ................................ 7-040199

[51] Int. Cl.$^6$ ............................................... G01L 9/06
[52] U.S. Cl. .................................... 73/721; 73/514.36
[58] Field of Search ...................... 73/504.12, 504.14, 73/504.15, 514.16, 514.33, 514.32, 720, 721, 726, 727; 257/696

[56] References Cited

U.S. PATENT DOCUMENTS

| | | | |
|---|---|---|---|
| 4,314,225 | 2/1982 | Tominaga | 73/721 |
| 5,012,386 | 4/1991 | McShane | 257/696 |
| 5,150,616 | 9/1992 | Kondo et al. | 73/514.33 |
| 5,415,044 | 5/1995 | Yamamoto | 73/514.33 |
| 5,460,044 | 10/1995 | Yamamoto | 73/514.16 |
| 5,606,128 | 2/1997 | Araki | 73/514.16 |

*Primary Examiner*—Christine K. Oda
*Attorney, Agent, or Firm*—Leydig, Voit & Mayer, Ltd.

[57] ABSTRACT

A semiconductor sensor includes a circuit board; a pedestal including stacked board-composing materials arranged sequentially on the circuit board and describing a mesh shape on the circuit board, the mesh shape including at least one central opening in which the circuit board is exposed; and a sensing element fixed to and supported on the pedestal as a cantilever.

3 Claims, 10 Drawing Sheets

1

SEMICONDUCTOR SENSOR INCLUDING LAMINATED SUPPORTING PEDESTAL

This disclosure is a division of patent application Ser. No. 08/582,055, filed Jan. 2, 1996.

BACKGROUND OF THE INVENTION

1. Field of the Invention

The present invention relates to the structures of semiconductor sensors such as a semiconductor pressure sensor and a semiconductor acceleration sensor (or accelerometer).

2. Description of the Related Art

FIG. 24 is a sectional view of a conventional or known semiconductor of what is called the can seal package type (namely, the hermetic seal package type). In the conventional semiconductor acceleration sensor of the can seal package type containing a hybrid integrated circuit board (hereunder referred to simply as an HIC board or card) 4, a pedestal 4b is placed on the HIC board 4 serving as a circuit card (or printed-circuit board), as shown in FIG. 24. Further, a sensor element (namely, a sensing element) 4a, the resistance of which changes when bent and deflected, is fixed to the pedestal 4b as a cantilever. The sensing element 4a is electrically connected to an interconnecting wire 7 or line (not shown) on the HIC board by using a wire bonding method. The HIC board 4 is bonded to a base 5 with an adhesive 6. Further, interconnecting lines and electronic components (not shown) are provided on the HIC board 4. Moreover, the base 5 is pierced with outer leads 4c and is sealed with glass. Furthermore, the HIC board 4 and each of the outer leads 4c are electrically bonded to each other with a wire by performing a wire bonding process. Additionally, a dome-like metallic cap 8 is placed and mounted on the base 5 by welding a peripheral rolled edge portion 8a thereto in such a manner as to cover the HIC board 4.

Such a semiconductor acceleration sensor can convert a minute acceleration into an electrical signal utilizing the piezoresistive effect due to the bending of the sensor element 4a. Further, an HIC board is provided with an amplifier circuit and a temperature-compensating circuit and thus can output a signal, which represents a change in acceleration, to an external device through the outer leads 4c.

Such a conventional semiconductor sensor of what is called the can seal package type is fabricated as follows. First, the outer leads 4c are attached to the base 5 by performing a glass seal process. In another step, the HIC board 4, on which the sensing element 4a is mounted, is bonded to the base 5 with an adhesive. Thereafter, the HIC board 4 and each of the outer leads 4c are bonded to each other by performing wire bonding. Further, the cap 8 is welded to the base 5. It is, therefore, required that the fabrication process of this conventional semiconductor acceleration sensor comprise many steps. Consequently, it is difficult to realize less costly products or sensors.

FIG. 25 is a sectional view of a semiconductor pressure sensor of the conventional chip-on-board (COB) type. In the semiconductor pressure sensor of the conventional COB type, a sensing element 9a is bonded onto an HIC board 9, which is provided with wires and resistors (not shown) and with outer leads of the single in-line lead 9b (SIL) attached to an edge portion thereof, by die bonding. Further, a box-like resin package 10 having thick walls covers the sensing element 9a which has edge portions 10a bonded to the HIC board 9 and is mounted thereto. Moreover, a hole 10b is bored in the top portion of the resin package 10. Such a semiconductor pressure sensor converts a pressure to an electrical signal by utilizing the piezoresistive effect of the sensing element 9a which bends when a pressure is exerted thereon.

Such a conventional semiconductor pressure sensor of the COB type is fabricated by bonding the resin package 10 to the HIC board on which the sensing element 9a is mounted.

The process of fabricating the aforementioned conventional semiconductor sensors, such as the semiconductor acceleration sensor and the semiconductor pressure sensor, comprises a large number of steps. Consequently, it is difficult to realize less costly products or sensors.

Accordingly, an object of the present invention is to provide a semiconductor sensor which can be easily fabricated so as to reduce the cost of the product or sensor.

SUMMARY OF THE INVENTION

To achieve the foregoing object, in accordance with an aspect of the present invention, there is provided a semiconductor sensor (hereunder sometimes referred to as a first semiconductor sensor) that comprises a flat circuit board, which has a sensing element mounted thereon and outer electrodes attached to a side edge portion thereof, and a resin package for protecting the circuit board, wherein the resin package has a groove into which the circuit board is fitted.

Thus, in the case of the first semiconductor sensor of the present invention, the circuit board is supported on the resin package by being fitted into the groove formed in the resin package. Consequently, the fabrication of this semiconductor sensor can be easily achieved. Moreover, this semiconductor sensor can be manufactured at a low cost.

Further, a practical embodiment (hereunder sometimes referred to as a second semiconductor sensor) of the first semiconductor sensor of the present invention is provided with a metallic cap to be fitted into the resin package in such a way as to cover the resin package.

Thus, in the case of the second semiconductor sensor of the present invention, the metallic cap is fitted into and covers the resin package. Consequently, the circuit board can be protected from external noises.

Moreover, in the case of a practical embodiment (hereunder sometimes referred to as a third semiconductor sensor) of the second semiconductor sensor of the present invention, the metallic cap has a disengagement preventing portion with which the resin package engages.

Thus, in the case of the third semiconductor sensor of the present invention, the metallic cap engages with the resin package through the disengagement preventing portion. Consequently, the metallic cap is prevented from being disengaged from the resin package owing to vibrations or the like.

Furthermore, in the case of a practical embodiment (hereunder sometimes referred to as a fourth semiconductor sensor) of the second or third semiconductor sensor of the present invention, the resin package has a sealing groove which surrounds edge portions of the metallic cap.

Thus, in the case of the fourth semiconductor sensor of the present invention, the edge portions of the metallic cap are surrounded by the sealing groove of the resin package. Thereby, the inside thereof is sealed. Consequently, the entry of foreign matters can be prevented.

Additionally, in the case of a practical embodiment (hereunder sometimes referred to as a fifth semiconductor sensor) of the first, second, third or fourth semiconductor sensor of the present invention, the resin package has mounting projections.

Thus, the fifth semiconductor sensor of the present invention is supported by inserting the mounting projections into holes bored in a mounting portion such as the circuit board, respectively. Thereby, this semiconductor sensor can be mounted to the board securely.

Besides, in the case of a practical embodiment (hereunder sometimes referred to as a sixth semiconductor sensor) of the second, third or fourth semiconductor sensor of the present invention, the metallic cap has mounting projections.

Thus, the sixth semiconductor sensor of the present invention is supported by inserting the mounting projections, which are provided in the metallic cap, into holes bored in a mounting portion such as the circuit board, respectively, and thereafter soldering the mounting projections thereto. Thereby, this semiconductor sensor can be mounted to the board more securely.

In addition, in the case of a practical embodiment (hereunder sometimes referred to as a seventh semiconductor sensor) of the fifth or sixth semiconductor sensor of the present invention, the mounting projection has a hole for a screw.

Thus, the seventh semiconductor sensor of the present invention is screwed to the circuit or system board. Thereby, this semiconductor sensor can be mounted thereto firmly. Moreover, this semiconductor sensor can be removed therefrom easily.

Further, in the case of a practical embodiment (hereunder sometimes referred to as an eighth semiconductor sensor) of the first, second, third, fourth, fifth, sixth or seventh semiconductor sensor of the present invention, a hole is bored in the resin package. Moreover, the eighth semiconductor sensor has a sealing structure or component provided between the circuit board and the resin package.

Thus, in the case of the eighth semiconductor sensor of the present invention, the circuit board and the resin package are sealed to thereby shut the inside of the resin package off from the outside or exterior thereof. Thereby, when testing this semiconductor sensor, a pipe for supplying or applying a pressure can be connected to the hole and moreover, a pressure can be applied to the inside of the resin package. Consequently, this semiconductor sensor can be easily tested.

Furthermore, in the case of a practical embodiment (hereunder sometimes referred to as a ninth semiconductor sensor) of the eighth semiconductor sensor of the present invention, the sealing component is an elastic ring-shaped member.

Thus, in the case of the ninth semiconductor sensor of the present invention, the circuit board and the resin package are sealed with the elastic ring-shaped member. Therefore, this semiconductor sensor can be constituted by already-existing purchases. Consequently, this semiconductor can be easily manufactured.

Additionally, in the case of another practical embodiment (hereunder sometimes referred to as a tenth semiconductor sensor) of the eighth semiconductor sensor of the present invention, the sealing component is a resin component printed on the circuit board.

Thus, in the case of the tenth semiconductor sensor of the present invention, the circuit board and the resin package are sealed with the resin component printed on the circuit board. Thereby, the resin is not removed from the semiconductor sensor. Moreover, the hermeticity can be enhanced.

Besides, in accordance with another aspect of the present invention, there is provided a semiconductor sensor (hereunder sometimes referred to as an eleventh semiconductor sensor) that comprises a substrate or circuit board, a pedestal formed by stacking up board composing materials on the board, and a sensing element which has a side portion fixed to the pedestal and is supported on the pedestal like a cantilever.

Thus, in the case of the eleventh semiconductor sensor of the present invention, the pedestal thereof is formed by stacking up the board composing materials. The eleventh semiconductor sensor is, therefore, made by stacking up printed elements when making the board. Therefore, there are no special parts or components for the pedestal.

In addition, in the case of a practical embodiment (hereunder sometimes referred to as an twelfth semiconductor sensor) of the eleventh semiconductor sensor of the present invention, the board composing material is shaped like a mesh.

Thus, in the case of the twelfth semiconductor sensor of the eleventh semiconductor sensor of the present invention, the board composing material, which composes the pedestal, is shaped like a mesh in such a manner that the surface of the foundation or substrate of the board is exposed. Consequently, the twelfth semiconductor sensor exhibits good adhesiveness between the pedestal and the sensing element. Namely, the reliability of the adhesion between the pedestal and the sensing element can be increased.

BRIEF DESCRIPTION OF THE DRAWINGS

Other features, objects and advantages of the present invention will become apparent from the following description of preferred embodiments with reference to the drawings in which like reference characters designate like or corresponding parts throughout several views, and in which.

DETAILED DESCRIPTION OF THE PREFERRED EMBODIMENTS

Hereinafter, the preferred embodiments of the present invention will be described in detail by referring to the accompanying drawings.

Embodiment 1

Figure 1:
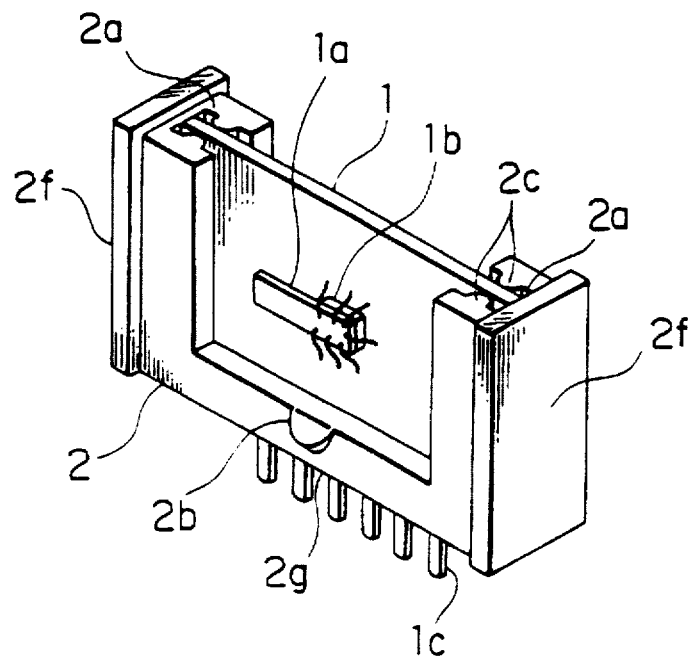
FIG. 1 is a perspective view of a practical example of a semiconductor sensor of the present invention, namely, a semiconductor acceleration sensor embodying the present invention, in which a cap is unfastened or removed therefrom.
Figure 2:
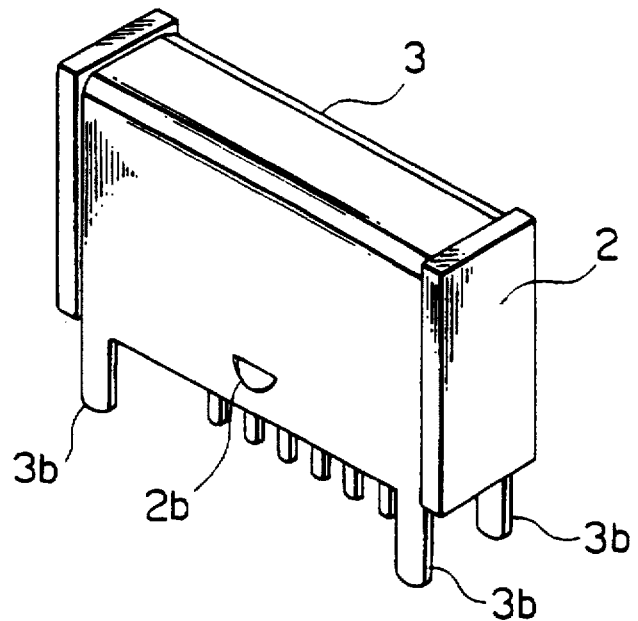
FIG. 2 is a perspective view of the semiconductor acceleration sensor embodying the present invention, which is in a state in which the metallic cap is put thereon.
Figure 3:
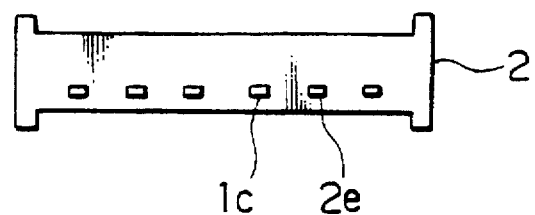
FIG. 3 is a rear view of the semiconductor acceleration sensor of FIG. 1.
Figure 4:
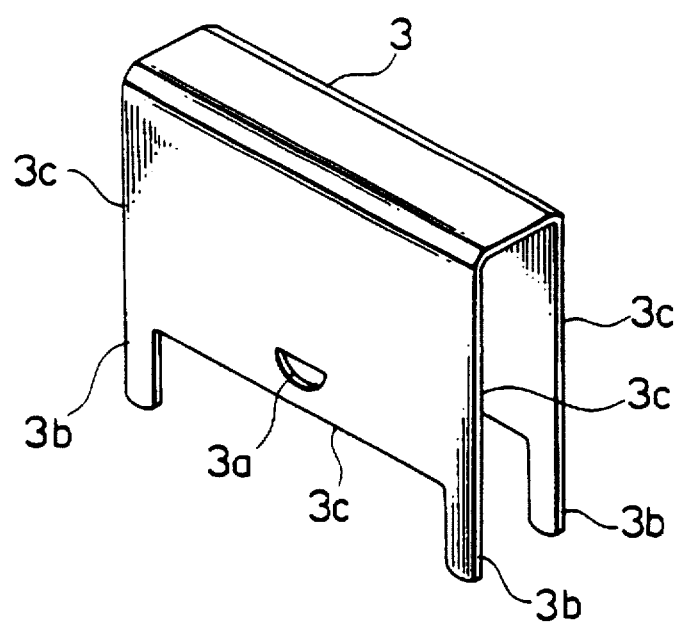
FIG. 4 is a perspective view of the metallic cap.

FIG. 1 is a perspective view of a practical example of a semiconductor sensor of the present invention, namely, a semiconductor acceleration sensor embodying the present invention, in which a cap 3 is removed therefrom. FIG. 2 is a perspective view of the semiconductor acceleration sensor embodying the present invention, in which the metallic cap 3 is put thereon. Further, FIG. 3 is a rear view of the semiconductor acceleration sensor of FIG. 1. FIG. 4 is a perspective view of the metallic cap 3. As shown in FIG. 1, a resin package 2 has a long side portions 2g and two short side potions 2f and is shaped nearly like a character "U". Further, a fitting groove 2a, into which a circuit board is fitted and inserted, is formed in the inside part of each of the two side portions 2f along the entire length thereof. Moreover, projections 2c, each of which has a semicircular transverse section, are formed on the opposed inner side-surfaces of each of the fitting grooves 2a throughout the length thereof. Furthermore, an HIC board 1, namely, a flat rectangular circuit board, three sides of which respectively correspond to the long and short side portions of the nearly U-shaped resin package 2, is fitted into the grooves 2a thereof. The opposed projections 2c formed in each of the fitting grooves 2a securely support the inserted HIC board 1 by pushing the board 1 at the top portions thereof and sandwiches the board 1 therebetween. The resin package 2 covers the three sides of the HIC board 1 to thereby protect the board 1. Further, a plurality of rod-like outer leads 1c serving as external electrodes are soldered to the long side portion of the HIC board on the same plane like the teeth of a comb. As shown in FIG. 3, small holes 2e are present in the long side portion of the U-shaped resin package along the long side thereof at regular intervals. Furthermore, interconnecting wires and electronic components (not shown) are provided on the HIC board 1. Additionally, a silicon pedestal 1b is provided on the HIC board 1. Moreover, a sensing element 1a is fixed to the pedestal 1b like a cantilever. Furthermore, the sensing element 1a is connected with the interconnecting wires (not shown) provided on the HIC board by a wire bonding.

FIG. 2 illustrates a state of this semiconductor acceleration sensor, in which the cap 3 is fitted into and covers the resin package 2. Namely, the U-shaped metallic cap cap 3, made by bending a steel plate as shown in FIG. 4, covers with the resin package 2 from above as viewed in FIG. 1. The metallic cap 3 has a side surface shaped into a rectangle, the three sides of which correspond to the three sides of the U-shaped resin package 2, respectively. The metallic cap 3 further has projections 3b provided at both end corners of long sides thereof, which are opposite to the bent long side portion thereof, as extensions of the short sides thereof. Moreover, a hole 3a, which engages a projection 2b formed on a side surface of the resin package 2 and acts as a disengagement preventing portion, is present in the metallic cap 3. When the package is covered with the metallic cap 3 from above, the bottom of the metallic cap 3 is deflected owing to the resilience thereof and is fitted thereinto. Furthermore, the projection 2b engages the hole 3a. Thereby, the metallic cap 3 cannot to come off the resin package 2.

In the case of the semiconductor sensor constructed as described hereinabove, part of the operations required for fabricating the conventional semiconductor sensor, for instance, the operations of bonding the HIC board to the base, of performing wire bonding between the HIC board and the outer leads and of welding the base to the cap become unnecessary. Namely, only the operation of fitting the HIC board and the cap to the resin package is required as that of fabricating the semiconductor sensor of the present invention. Thus the number of man-hours needed the fabrication of the semiconductor sensor can be reduced considerably. Consequently, low-cost products or sensors can be realized. Incidentally, in the case of the conventional semiconductor sensor, the cap is welded to the base so as to enhance the corrosion resistance. Thereby, the airtightness of the inside of the cap becomes high. In contrast, in the case of the semiconductor sensor of the present invention, the corrosion resistance is enhanced by covering the surface of the sensing element or the electrode portions of the sensing element and the HIC board with silicone gel or the like. Thus, even if the airtightness of the semiconductor sensor of the present invention is not so high, there is no obstacle to operation. Namely, the airtightness of this embodiment suffices for trouble-free operation of the semiconductor sensor of the present invention.

The metallic cap 3 enables mechanical protection of the inside of the product or sensor, as well as electrical protection thereof from external noises or the like. Further, as illustrated in FIG. 4, the metallic cap 3 has mounting projections 3b for holding the product. Thereby, the sensor of the present invention can be held by soldering the system board.

Embodiment 2

Figure 5:
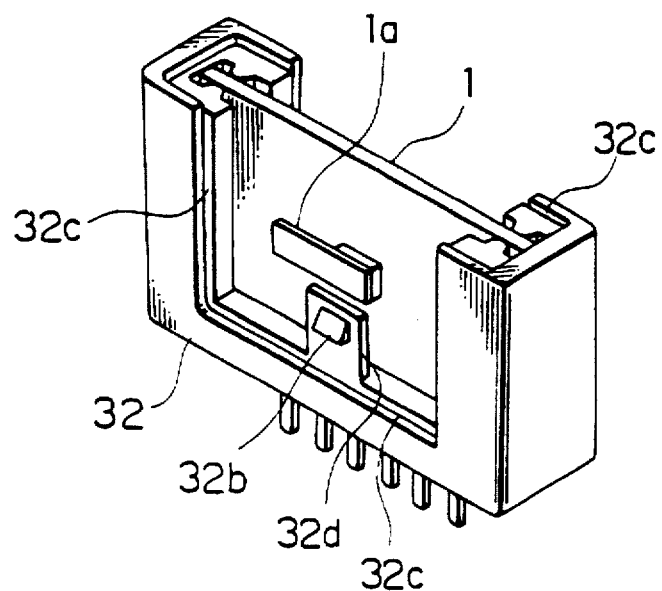
FIG. 5 is a perspective view of another practical example of the semiconductor sensor of the present invention, namely, another semiconductor acceleration sensor embodying the present invention, in which a cap is removed therefrom.
Figure 6:
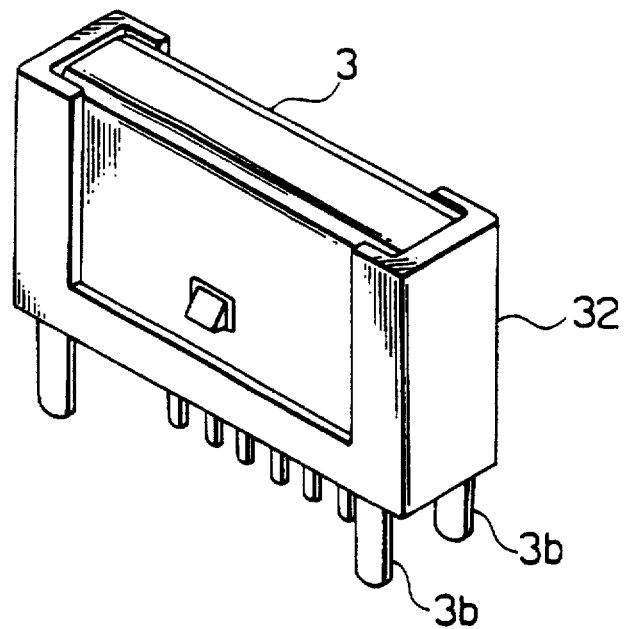
FIG. 6 is a perspective view of the semiconductor acceleration sensor embodying the present invention, in which the metallic cap is put thereon.
Figure 7:
FIG. 7 is a rear view of the semiconductor acceleration sensor of FIG. 6.

FIG. 5 is a perspective view of another semiconductor sensor embodying the present invention, namely, another semiconductor acceleration sensor embodying the present invention, in which the cap 3 is removed therefrom. FIG. 6 is a perspective view of this semiconductor acceleration sensor, in which the metallic cap 3 is put thereon. FIG. 7 is a rear view of the semiconductor acceleration sensor of FIG. 6. As illustrated in FIG. 5, a sealing groove 32c is provided in the nearly U-shaped resin package 32 in such a way as to surround edge portions 3c of the metallic cap 3 when this sensor is covered with the cap 3.

The metallic cap 3 is pushed into and attached to the resin package 32 in such a manner that edge portions 3c thereof are fitted into the sealing grooves 32c. Further, holes 32f, through which the projections 3b penetrate, respectively, are located in the bottom portion of the sealing groove 32c of the resin package 32. Moreover, the projections 3b protrude outwardly therefrom as mounting projections. Furthermore, a flat plate 32d is located on each of parts of the nearly central portion of the U-shaped resin package 32, which are on the inside of and close to the two sealing grooves 32c, respectively. Additionally, projections 32b are provided at nearly central portions of the outside surface of the flat plate 32d and engage with the holes 3a of the metallic cap 3. Thereby, the metallic cap 3 does not come off of the resin package 32. Incidentally, the remainder of the composing elements of this embodiment are similar to the corresponding ones of Embodiment 1

In the case of the semiconductor sensor constructed as described hereinabove, namely, in the case of Embodiment 2, the edge portions 3c of the metallic cap 3 are seated in the sealing grooves 32c of the resin package 32. Thereby, the inner space of the metallic cap 3 is sealed. Consequently, the entry of foreign matter can be prevented. Moreover, the electronic components such as the sensing element 1a and the interconnecting wires, which are present in the inner space thereof, can be protected. The corrosion resistance of the product or sensor can be enhanced. Thus, the reliability of the semiconductor sensor can be improved. Furthermore, the life thereof can be increased.

Embodiment 3

Figure 8:
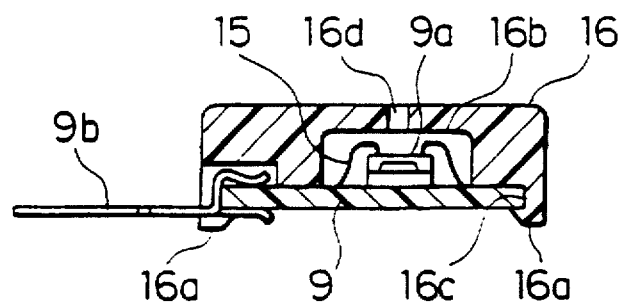
FIG. 8 is a sectional view of a further practical example of the semiconductor sensor of the present invention, namely, a semiconductor pressure sensor embodying the present invention.
Figure 9:
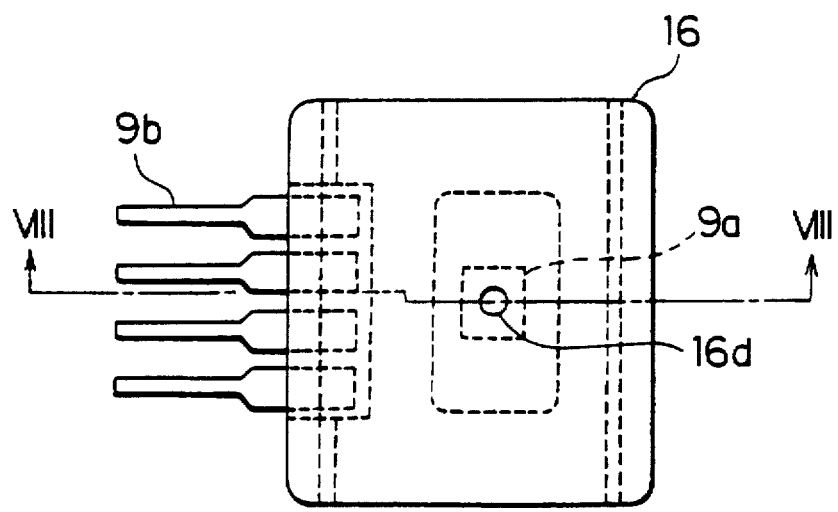
FIG. 9 is a front view of the semiconductor pressure sensor of FIG. 8.

FIG. 8 is a sectional view of a further semiconductor sensor embodying the present invention, namely, a semiconductor pressure sensor embodying the present invention, which is taken on line 8—8 of FIG. 9. Further, FIG. 9 is a front view of the semiconductor pressure sensor of FIG. 8. As illustrated in FIG. 8, the resin package 16 has an almost rectanguler shape. Further, the central portion of the resin package 16 is dented, and a concave portion 16b is formed therein. Moreover, projections 16a, each of which has a section shaped like a hook, are provided along the two side edges of the bottom of the package 16 as shown in the lower right and left portions of FIG. 8. Thus, grooves 16c, into which the circuit board is fitted, are formed. Furthermore, a hole 16d is formed in the top portion of the resin package 16.

Further, the resin package 16 is attached to the HIC board 9, which has the sensing element 9a mounted thereon and further has outer leads 9b of the SIL type serving as external electrodes attached to edge portions thereof, by engaging the edge portions of the HIC board 9 with the grooves 16c, respectively. A part of the projection 16a provided on the left side of the resin package 16 is cut away therefrom so as to permit the outer leads 9b to project from the package 16. The concave portion 16b of the resin package 16 is formed in such a way as to have a large space or room for containing the sensing element 9a mounted on the HIC board.

The fabrication of the semiconductor pressure sensor having such a structure is performed by spreading the projection portions 16a of the flexible resin package 16 and next engaging these portions of the package 16 with the edges of the HIC board 9 in such a way that these edges engage portions of the package 16, respectively. Thereby, the gluing of the resin package 16 to the HIC board 9, which is necessary for fabricating the conventional semiconductor sensor, can be eliminated. Thus, this embodiment can be fabricated by performing only the fitting operations. Consequently, the number of man-hours needed to the fabrication of the semiconductor sensor can be reduced considerably. Moreover, low-cost products or sensors can be realized.

Embodiment 4

Figure 10:
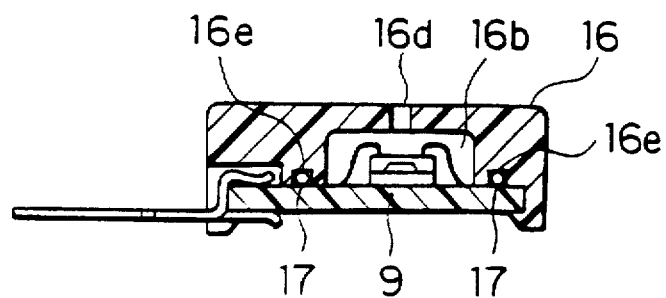
FIG. 10 is a sectional view of still another practical example of the semiconductor sensor of the present invention, namely, another semiconductor pressure sensor embodying the present invention.
Figure 11:
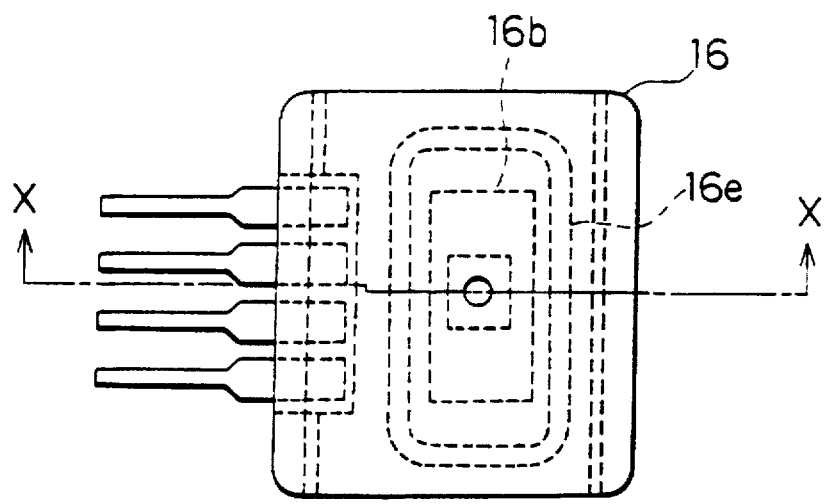
FIG. 11 is a front view of the semiconductor pressure sensor of FIG. 10.

FIG. 10 is a sectional view of still another semiconductor sensor embodying the present invention, namely, another semiconductor pressure sensor embodying the present invention, which is taken on line 10—10 of FIG. 11. FIG. 11 is a front view of the semiconductor pressure sensor of FIG. 10. For the purpose of improving the airtightness between the resin package 16 and the HIC board 9, this embodiment further has a groove 16e surrounding the concave portion 16b formed in the bottom part of the resin package 16, which faces the HIC board 9, and also has an O-ring 17, which is an elastic ring-like member placed in the groove 16e, in addition to the elements of Embodiment 3.

With such a structure, this embodiment can enhance the airtightness between the resin package 16 and the HIC board 9 by using the O-ring 17. In the case of testing the semiconductor pressure sensor, a pipe for supplying or applying a pressure can be connected with the hole 16d bored in the top portion of the resin package 16 and moreover, pressure can be applied to a space formed or defined by the HIC board and the concave portion 16b of the resin package 16. Consequently, this semiconductor sensor can be tested. Incidentally, in the case of a semiconductor pressure sensor in which there is no airtightness between the resin package 16 and the HIC board 9, the semiconductor pressure sensor is tested after being put into an apparatus which can apply pressure to the entire semiconductor pressure sensor.

Embodiment 5

Figure 12:
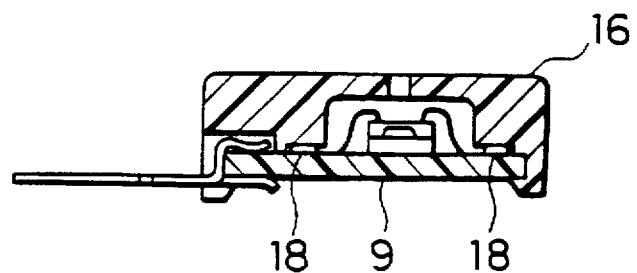
FIG. 12 is a sectional view of yet another practical example of the semiconductor sensor of the present invention, namely, still another semiconductor pressure sensor embodying the present invention.

FIG. 12 is a sectional view of yet another semiconductor sensor embodying the present invention, namely, still another semiconductor pressure sensor embodying the present invention. In the case of this embodiment, an elastic resin element 18 is first printed on the HIC board 9 instead of using the O-ring 17 of the aforementioned Embodiment 4. Thereafter, the resin package 16 is mounted on the HIC board 9. With such a structure, this embodiment can eliminate the troublesomeness which would be caused by the fitting of the O-ring 17 into the HIC board when fabricating the aforementioned Embodiment 4. Further, in the case of Embodiment 5, when disassembling the semiconductor pressure sensor, the resin element 18 does not break away. Thus, the troublesomeness is reduced when disassembling the sensor. Moreover, in the case of this embodiment, the airtightness is enhanced in comparison with the case of using the O-ring.

Embodiment 6

Figure 13:
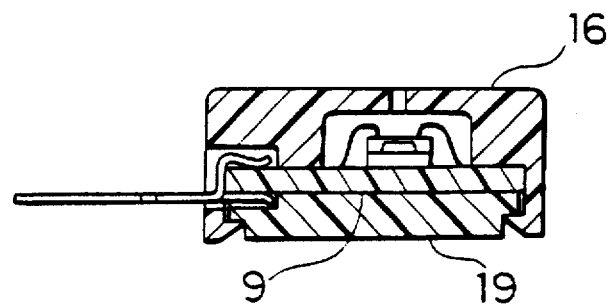
FIGS. 13 to 17 are sectional views of other practical examples of the semiconductor sensor of the present invention, namely, other semiconductor pressure sensors, respectively.
Figure 14:
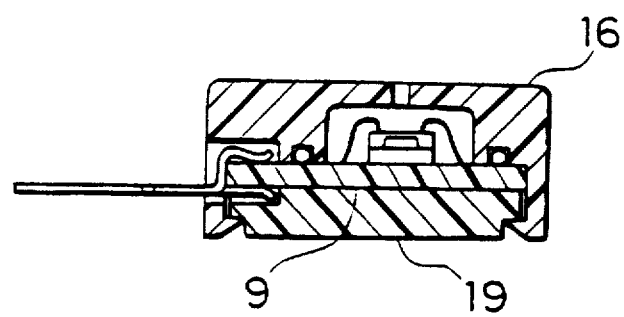

FIGS. 13 and 14 are sectional views of examples of another semiconductor sensor embodying the present invention, namely, other semiconductor pressure sensors embodying the present invention, respectively. This embodiment (namely, each of these semiconductor pressure sensors) is constituted by placing a plate 19 on the rear or back surface of the HIC board 9 of each of Embodiments 3 and 4. Further, the resin package 16 is fastened to the HIC board 9 through the plate 19. The surfaces of the HIC board 9 are covered with what is called "over-glass" and are easily affected by a shock. With such a structure, a stress occurring in the HIC board 9 at the time of fitting the package 16 thereinto can be alleviated. Moreover, after the HIC board is manufactured as a product, the HIC board 9 can be protected from external shock.

Embodiment 7

Figure 15:
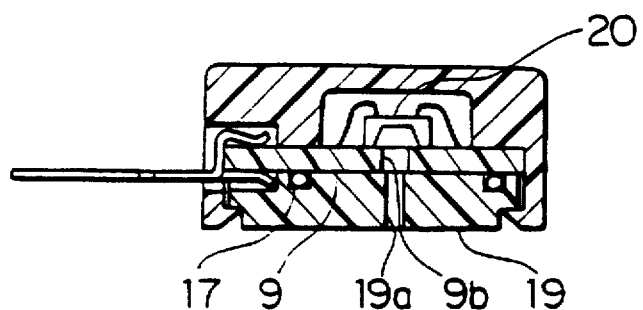

FIG. 15 is a sectional view of another semiconductor sensor embodying the present invention, namely, another semiconductor pressure sensor embodying the present invention. This embodiment is a semiconductor pressure sensor 20 of what is called the back-receiving-pressure type. As illustrated in this figure, holes 9b and 19a for introducing pressure are present in the HIC board 9 and the plate 19, respectively. Further, the airtightness between the HIC board 9 and the plate 19 is maintained by using the O-ring 17. Thereby, a pressure can be received at the back of this sensor.

Embodiment 8

Figure 16:
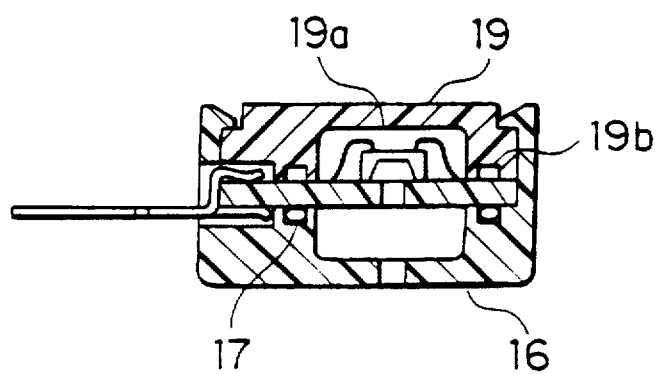
Figure 17:
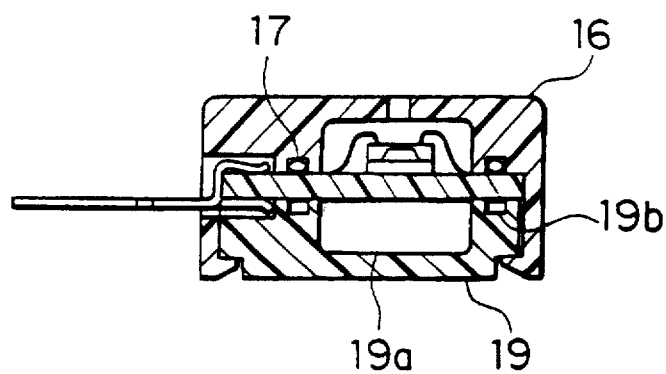

FIGS. 16 and 17 are sectional views of examples of another semiconductor sensor embodying the present invention, namely, other semiconductor pressure sensors embodying the present invention, respectively. As shown in these figures, a concave portion 19a, which provides a space, and a groove 19b, which contains an O-ring, are formed in the plate 19. Further, these structures are also of the front-receiving-pressure type and the back-receiving-pressure type, which depends on the manner of mounting the circuit in the package, can be provided for the semiconductor pressure sensor. Thereby, components or parts of the sensor can be shared by those of the front-receiving-pressure type and of the back-receiving-pressure type.

Embodiment 9

Figure 18:
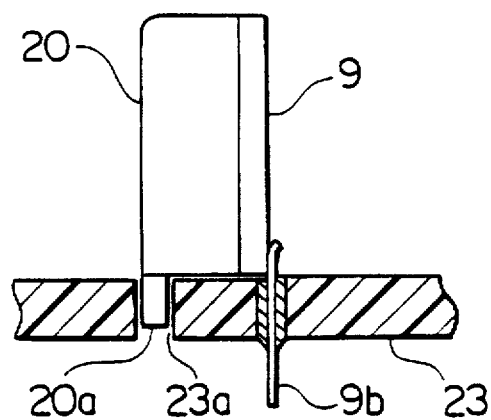
FIGS. 18 to 20 are diagrams illustrating other practical examples of the semiconductor sensor of the present invention, namely, other semiconductor pressure sensors embodying the present invention, each of which is mounted on a system substrate or board.
Figure 19:
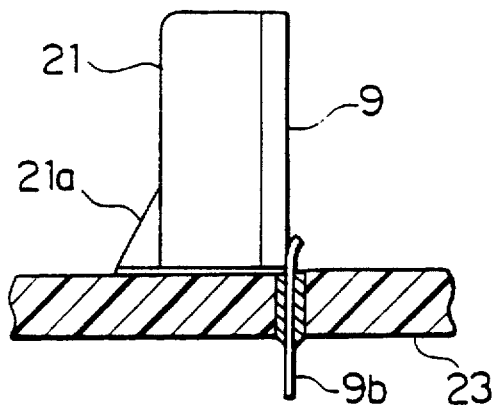
Figure 20:
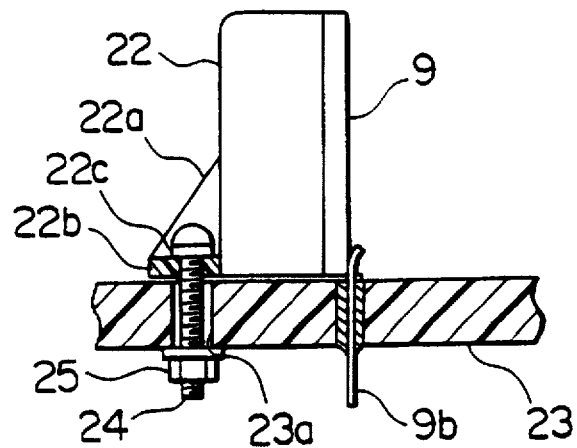

FIGS. 18, 19 and 20 are diagrams for illustrating examples of another semiconductor sensor embodying the present invention, namely, other semiconductor pressure sensors embodying the present invention, each of which is mounted on a system circuit board. As illustrated in FIG. 18, a resin package 20 is bonded or glued to the HIC board 9 which has a sensing element 9a (not shown) mounted thereon and further has outer leads 9b of the SIL type attached to edge portions thereof, as in the case of the conventional semiconductor sensor. Further, a projection 20a is provided on the bottom edge of a principal face, which is opposite to the outer leads, of the resin package 20 and the edges of side faces thereof. When mounting the semiconductor pressure sensor on the system board 23, this projection 20a is inserted into a hole 23a bored in the system board 23. Furthermore, this projection 20a securely fixes the semiconductor sensor to the system board 23 in collaboration with the outer leads 9b soldered to the system circuit board. Thereby, even when a vibration or a shock occurs, the product or sensor can be held securely.

In the case of the embodiment of FIG. 19, a resin package 21 is bonded or glued onto the HIC board 9, as in the case of the conventional semiconductor sensor. Moreover, a stabilizer 21a is provided on a side edge of the principal face of the resin package 21 in such a manner that the stabilizer 21a and the corresponding side face of the resin package 21 are in a same plane. When fixing the semiconductor sensor to the system circuit board 23 by soldering the outer leads 9b thereto, this stabilizer 21a faces the system circuit board 23 and supports and stabilizes the semiconductor sensor. Further, this stabilizer 21a can be provided on each of the resin packages 2 and 32 of Embodiments 1 and 2.

In the case of the embodiment of FIG. 20, a flange portion 22b is formed in a stabilizer 22a provided on a side edge portion of a principal face of a resin package 22 in such a way that the corresponding side face of the resin package 22 and the flange portion 22b are in a same plane. Further, a hole 22c is located in the flange portion 22b. Moreover, a hole 23a is located in the system circuit board 23 at a position where the semiconductor pressure sensor is fixed. Thus, the semiconductor pressure sensor is fixed to the system board by piercing the hole 22c and the hole 23a with a screw 24 and fastening the flange portion 22b to the system circuit board 23. With such a structure, the semiconductor pressure sensor can be securely fixed to the system circuit board. When a vibration or a shock occurs, the semiconductor pressure sensor can be securely held.

Embodiment 10

This embodiment is constituted by replacing the sensing element 1a having the cantilever structure of each of Embodiments 1 and 2 with an acceleration sensing element (not shown) which does not have a cantilever structure.

Further, this embodiment can be constituted as a semiconductor acceleration sensor by replacing the sensing element 9a of the semiconductor pressure sensor in the case of each of Embodiments 3 to 9 with the sensing element 1a of the cantilever structure of each of Embodiments 1 and 2.

Embodiment 11

Figure 21:
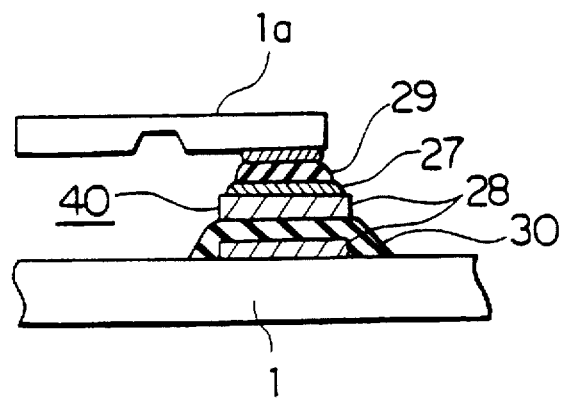
FIG. 21 is a partially sectional view of another practical example of the semiconductor sensor of the present invention, namely, another semiconductor pressure sensor embodying the present invention.

FIG. 21 is a partially sectional view of another semiconductor sensor embodying the present invention, namely, another semiconductor pressure sensor embodying the present invention. Generally, an HIC board is constructed by printing or transferring the board composing elements such as a resistor, a conductor, what is called "cross-glass" and what is called "over-glass" onto necessary positions through the use of printing techniques. In place of the silicone pedestal 1b supporting the sensing element 1a like a cantilever on the HIC board 1 of the semiconductor acceleration sensor of the cantilever type, this embodiment employs a pedestal 40 formed by stacking up a resistor 27, a conductor 28, an "over-glass" portion 29 and a "cross-glass" portion 30 to a predetermined height at a position where the pedestal 1b would be placed. Moreover, the sensing element 1a is fixedly mounted thereon to thereby realize a semiconductor acceleration sensor having the cantilever structure.

As the result of having such a configuration, the necessity for having special components for use in a pedestal can be obviated. Moreover, an operation of bonding or gluing the pedestal 1b to the board can be eliminated. Furthermore, a resistor, which should be originally placed at a location other than the pedestal, can be placed on the pedestal. Thereby, the size of the entire sensor can be reduced.

Embodiment 12

Figure 22:
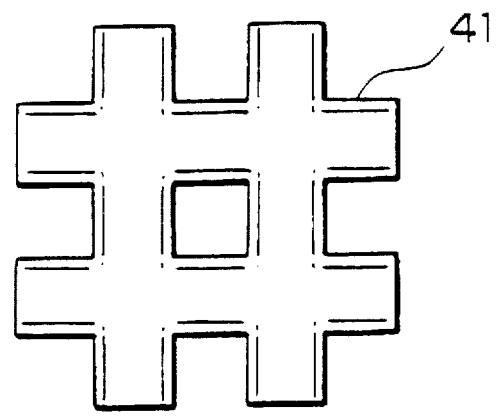
FIG. 22 is a front view of a further practical example of the semiconductor sensor of the present invention, namely, an additional semiconductor pressure sensor embodying the present invention.

FIG. 22 is a front view of a further semiconductor sensor embodying the present invention, namely, an additional semiconductor pressure sensor embodying the present invention.

Figure 23:
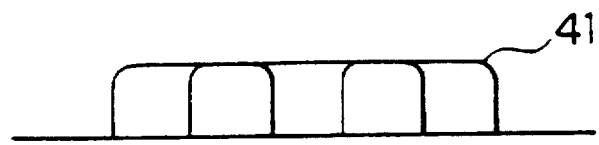
FIG. 23 is a side view of the semiconductor pressure sensor of FIG. 22.
Figure 24:
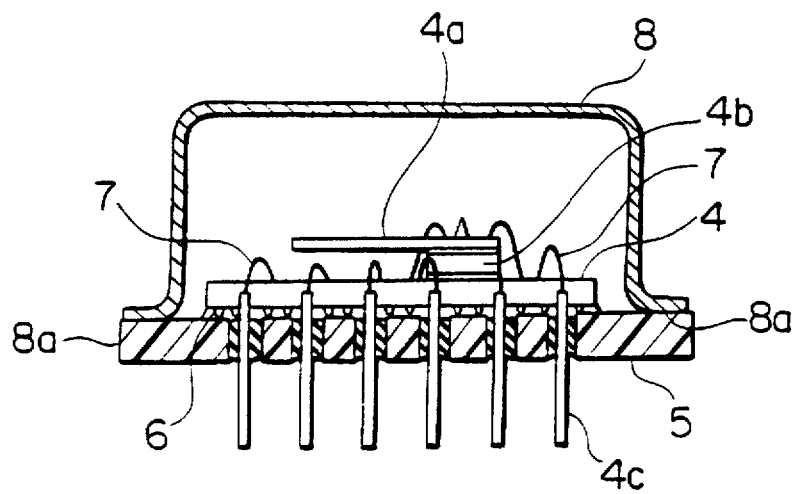
FIG. 24 is a sectional view of the conventional semiconductor acceleration sensor of the can seal package type.
Figure 25:
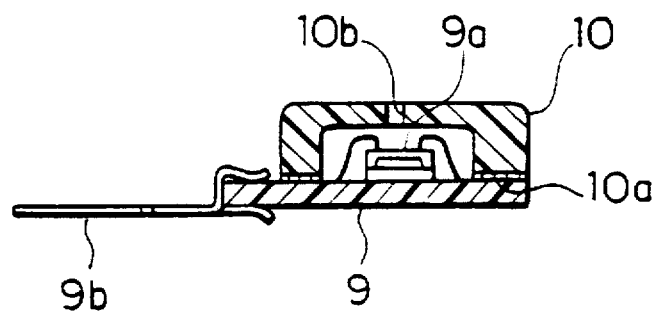
FIG. 25 is a sectional view of the conventional semiconductor pressure sensor of the COB type.

FIG. 23 is a side view of the semiconductor pressure sensor of FIG. 22. In the case of this embodiment, a mesh-like pedestal 41 is formed by shaping each of the resistor 27, the conductor 28, the "over-lass" portion 29 and the "cross-glass" portion 30 into a mesh. The reliability of the bonding of the pedestal 41 onto the HIC board can be enhanced by giving the pedestal such a shape. Namely, the stability thereof can be increased.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A semiconductor sensor comprising:

a circuit board;

a pedestal including stacked board-composing materials disposed on the circuit board, the stacked board-composing materials including, sequentially arranged, a first metal layer, a first glass layer, a second metal layer, a resistance layer, and a second glass layer; and a sensing element fixed to and supported on the pedestal as a cantilever.

2. A semiconductor sensor comprising:

a circuit board;

a pedestal including stacked materials arranged sequentially on the circuit board and describing a mesh shape on the circuit board, the mesh shape including at least one central opening in which the circuit board is exposed; and a sensing element fixed to and supported on the pedestal as a cantilever.

3. A semiconductor sensor comprising:

a circuit board composed of board-composing materials;

a pedestal consisting only of the board-composing materials and disposed on the circuit board, wherein the board-composing materials include a resistance layer, an electrically conductive layer, and a glass layer, and a sensing element fixed to and supported on the pedestal as a cantilever.

* * * * *